(12) United States Patent
Takashima

(10) Patent No.: US 10,644,065 B2
(45) Date of Patent: May 5, 2020

(54) NONVOLATILE MEMORY DEVICE

(71) Applicant: TOSHIBA MEMORY CORPORATION, Minato-ku (JP)

(72) Inventor: Daisaburo Takashima, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 16/353,226

(22) Filed: Mar. 14, 2019

(65) Prior Publication Data

US 2020/0091233 A1 Mar. 19, 2020

(30) Foreign Application Priority Data

Sep. 14, 2018 (JP) ................. 2018-172411

(51) Int. Cl.
*G11C 13/00* (2006.01)
*H01L 27/24* (2006.01)
*H01L 45/00* (2006.01)

(52) U.S. Cl.
CPC ........ *H01L 27/2427* (2013.01); *G11C 13/004* (2013.01); *G11C 13/0069* (2013.01); *H01L 27/249* (2013.01); *H01L 45/126* (2013.01); *H01L 45/1233* (2013.01); *G11C 13/0004* (2013.01); *G11C 13/0007* (2013.01); *G11C 2013/0045* (2013.01);
(Continued)

(58) Field of Classification Search
CPC .............. G11C 13/004; G11C 13/0069; G11C 2013/0045; G11C 2213/72; G11C 2213/15; G11C 2013/0078; G11C 13/0004; G11C 2213/31; G11C 13/0007; G11C 2213/71; G11C 2213/32; H01L 27/2427; H01L 27/249; H01L 45/126; H01L 45/1233; H01L 45/147; H01L 45/08; H01L 45/146; H01L 45/06; H01L 45/144

See application file for complete search history.

(56) References Cited

U.S. PATENT DOCUMENTS 5,894,447 A * 4/1999 Takashima ............ H01L 27/228 365/158
7,359,234 B2 * 4/2008 Inaba ..................... G11C 5/063 365/158

(Continued)

FOREIGN PATENT DOCUMENTS

| JP | 2009-534835 | 9/2009 |
|---|---|---|
| JP | 2016-535384 | 11/2016 |
| JP | 6201056 | 9/2017 |

Primary Examiner — Khamdan N. Alrobaie
(74) Attorney, Agent, or Firm — Oblon, McClelland, Maier & Neustadt, L.L.P.

(57) ABSTRACT

According to one embodiment, a nonvolatile memory device includes a memory cell including a first two-terminal resistance change memory element storing memory cell information, and a second two-terminal resistance change memory element, connected in series to the first two-terminal resistance change memory element, and functioning as a selector element, word and bit lines connected to the memory cell. When memory cell information is to be written, if the memory cell is a selected memory cell, the second two-terminal resistance change memory element is set to the low resistance state and, if the memory cell is an unselected memory cell, the second two-terminal resistance change memory element is set to the high resistance state.

11 Claims, 13 Drawing Sheets

(52) U.S. Cl.
CPC .. *G11C 2013/0078* (2013.01); *G11C 2213/15* (2013.01); *G11C 2213/31* (2013.01); *G11C 2213/32* (2013.01); *G11C 2213/71* (2013.01); *G11C 2213/72* (2013.01); *H01L 45/06* (2013.01); *H01L 45/08* (2013.01); *H01L 45/144* (2013.01); *H01L 45/146* (2013.01); *H01L 45/147* (2013.01)

(56) References Cited

U.S. PATENT DOCUMENTS

| | | | |
|---|---|---|---|
| 7,742,331 B2* | 6/2010 | Watanabe | G11C 13/0004 365/148 |
| 7,864,567 B2 | 1/2011 | Gordon et al. | |
| 9,312,005 B2 | 4/2016 | Castro | |
| 9,865,341 B2 | 1/2018 | Lee et al. | |
| 2007/0247899 A1* | 10/2007 | Gordon | G11C 13/0004 365/163 |
| 2010/0091551 A1* | 4/2010 | Hosono | G11C 13/0004 365/148 |
| 2013/0077384 A1* | 3/2013 | Azuma | G11C 11/21 365/148 |
| 2015/0357032 A1* | 12/2015 | Tatsumura | H03K 19/1776 365/72 |
| 2018/0277202 A1* | 9/2018 | Iizuka | G11C 7/04 |

* cited by examiner

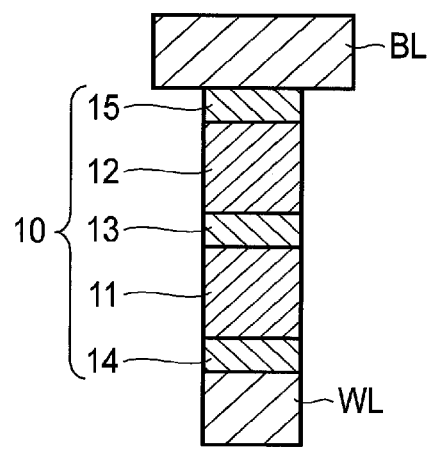
F I G. 1
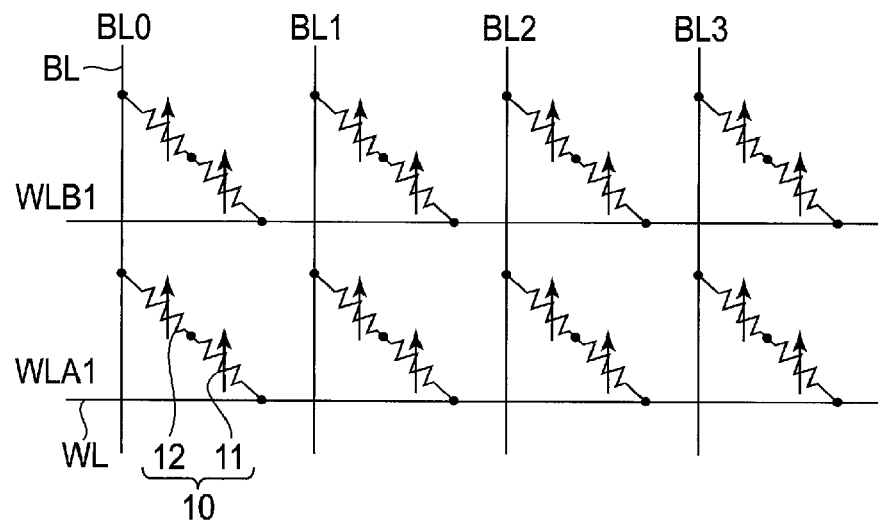
F I G. 2
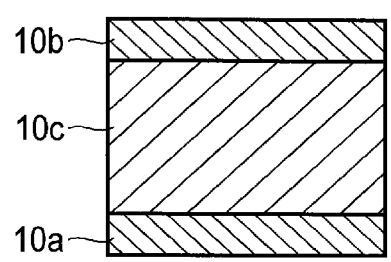
F I G. 3

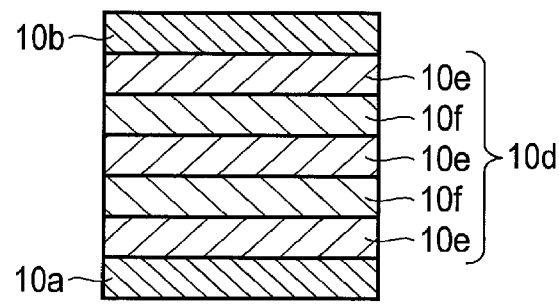
F I G. 4
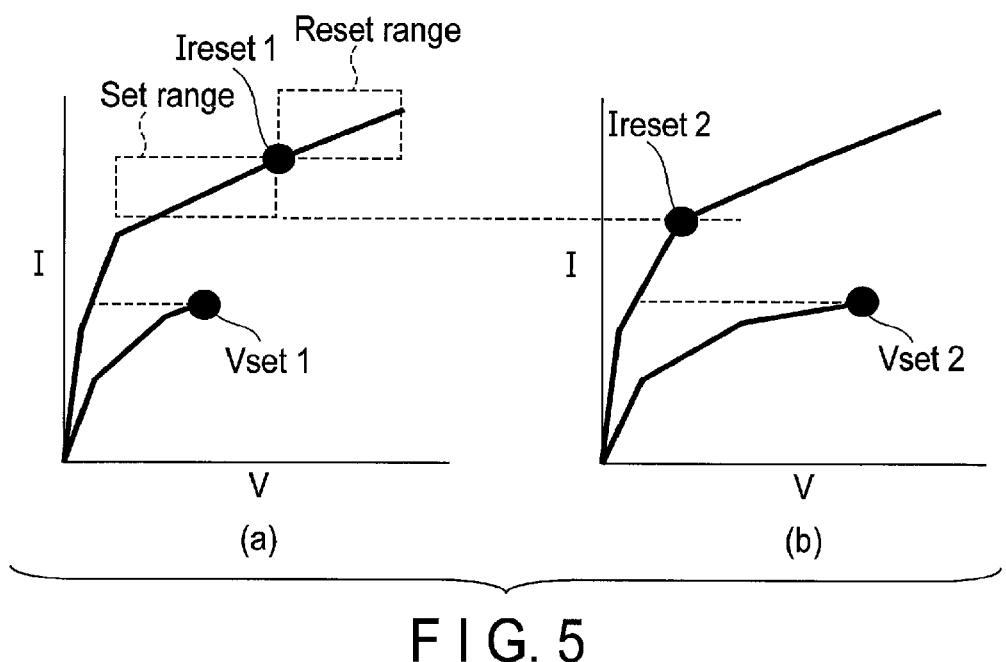
F I G. 5
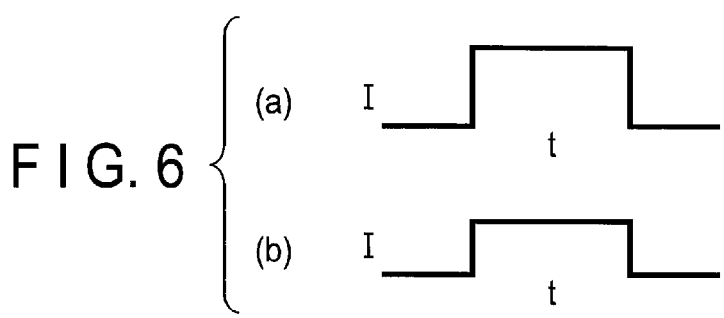
F I G. 6

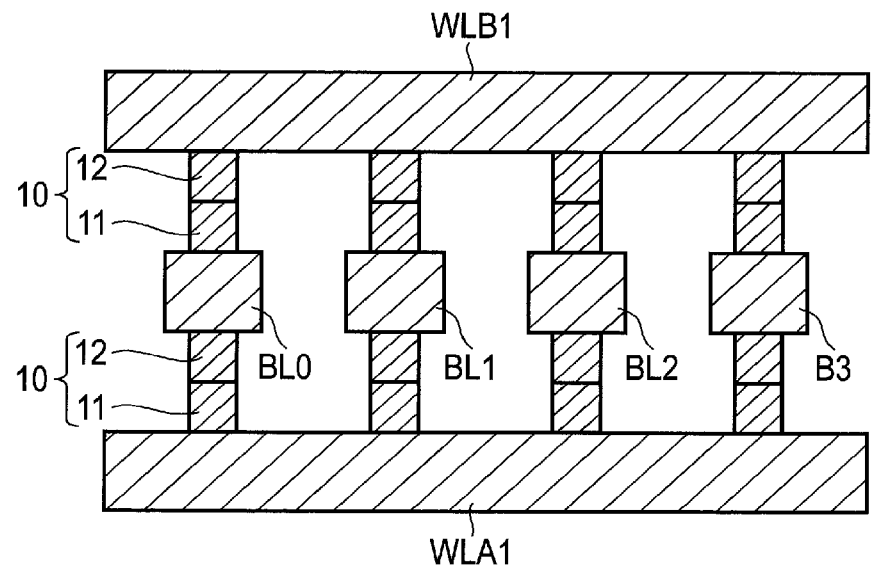
F I G. 7
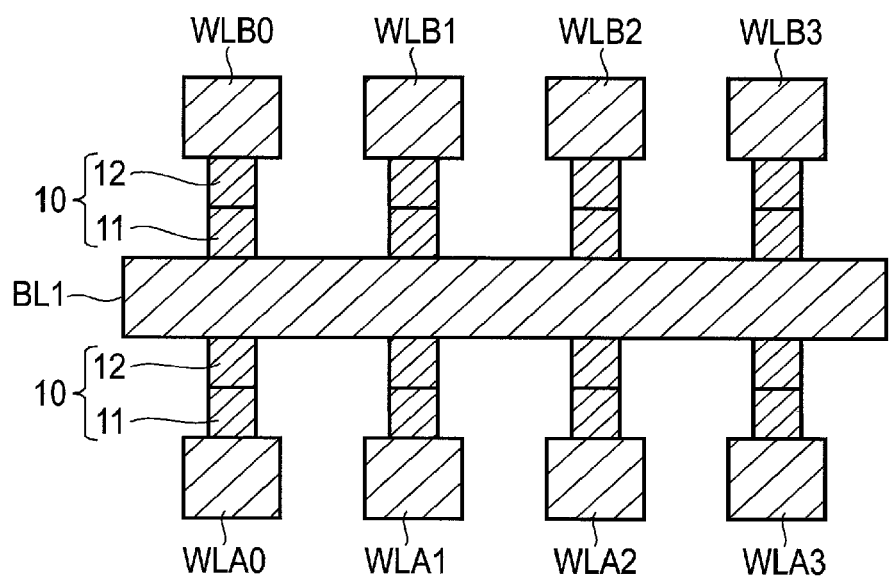
F I G. 8

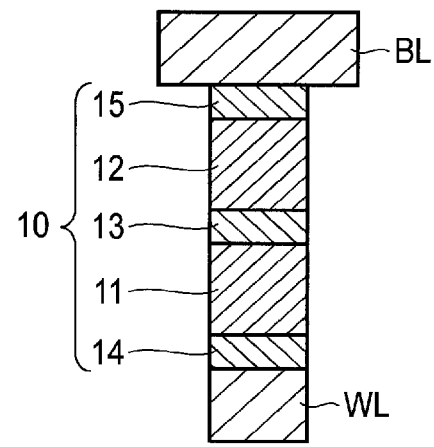
F I G. 9
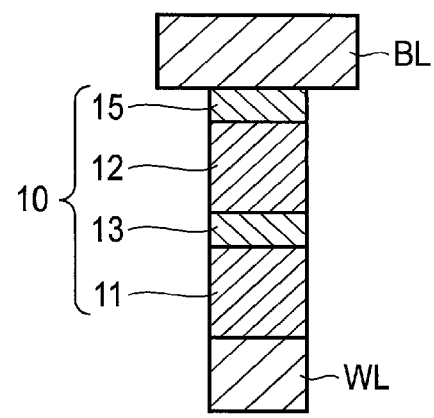
F I G. 10

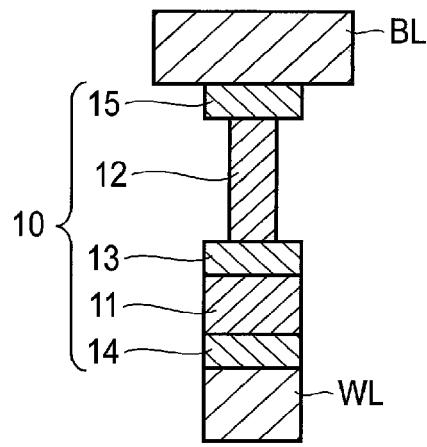
FIG. 11
| | Standby | Set/Reset period | After Set | After Reset |
|---|---|---|---|---|
| Selector element | Off | On | Off | Off |
| Memory element | On/Off | On | On | Off |
FIG. 12
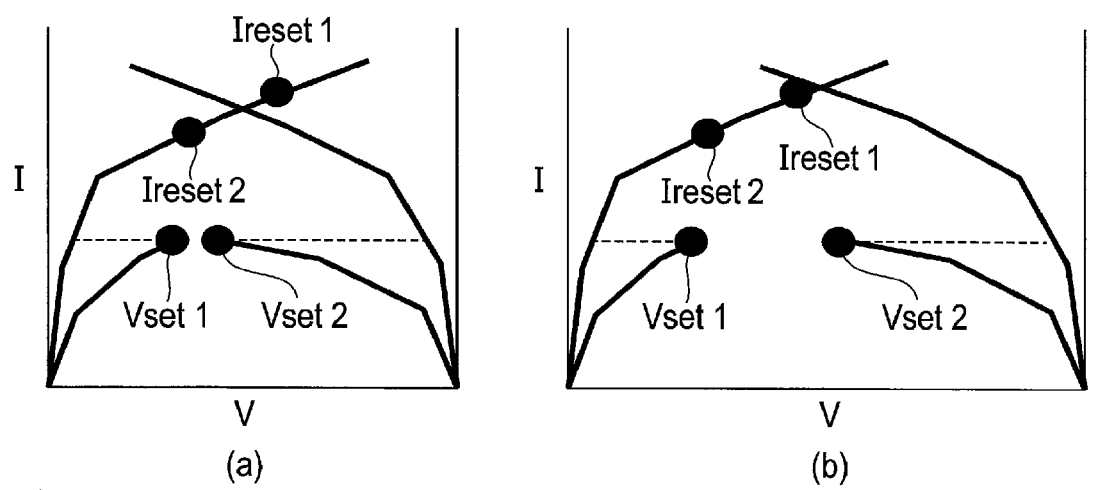
FIG. 13

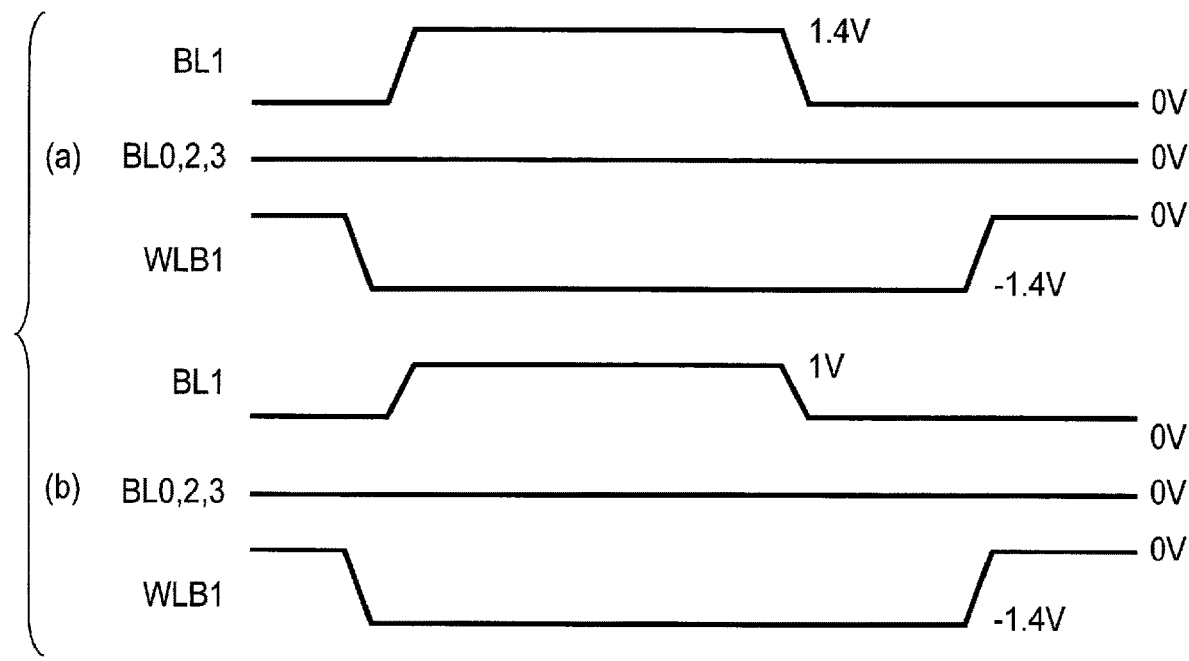
F I G. 14
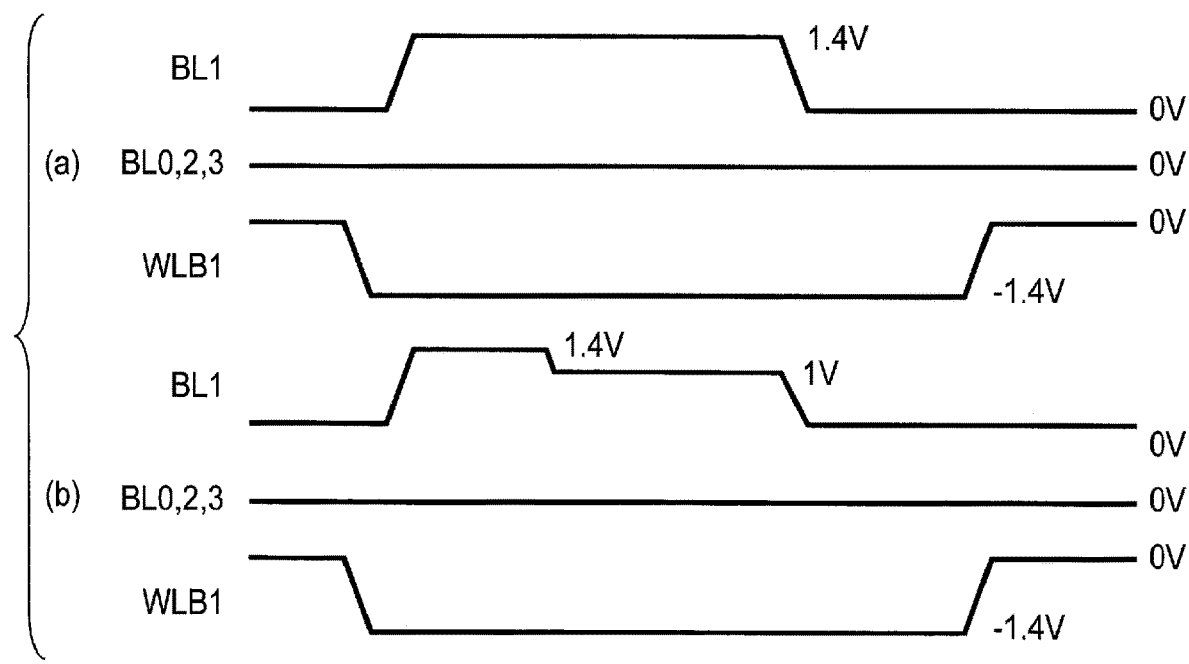
F I G. 15

| | Standby | Selector element-nondestructive Read |
|---|---|---|
| Selector element | Off | Off |
| Memory element | On/Off | On/Off |
F I G. 16
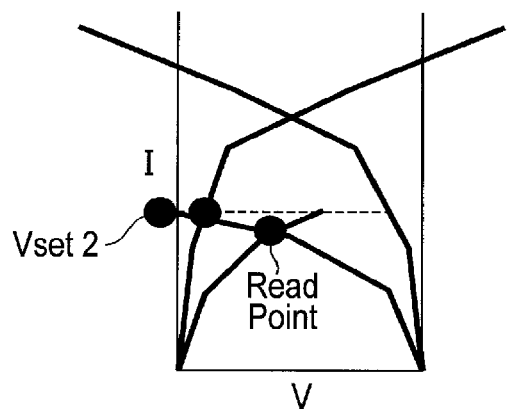
F I G. 17
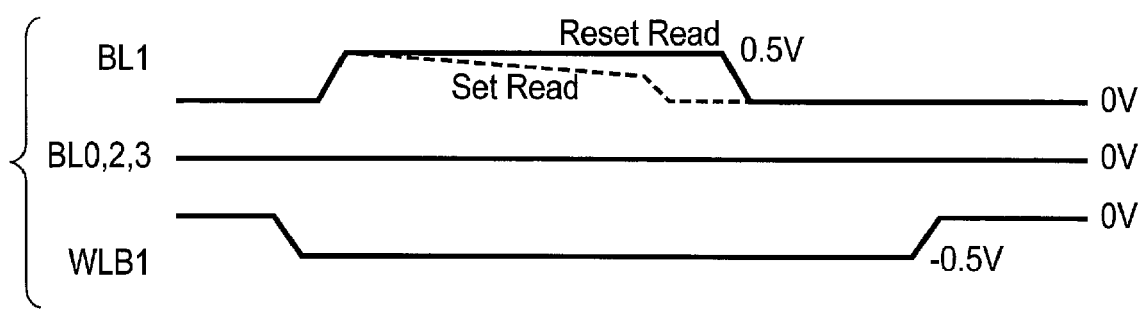
F I G. 18

| | Standby | Selector element-destructive Read | Undetermined Restore period | After Set | After Reset |
|---|---|---|---|---|---|
| Selector element | Off | On/Off | On/Off | Off | Off |
| Memory element | On/Off | On/Off | On/Off | On | Off |
(a)
| | Standby | Selector element-destructive Read | Determined Restore period | After Set | After Reset |
|---|---|---|---|---|---|
| Selector element | Off | On/Off | On | Off | Off |
| Memory element | On/Off | On/Off | On | On | Off |
(b)
F I G. 19
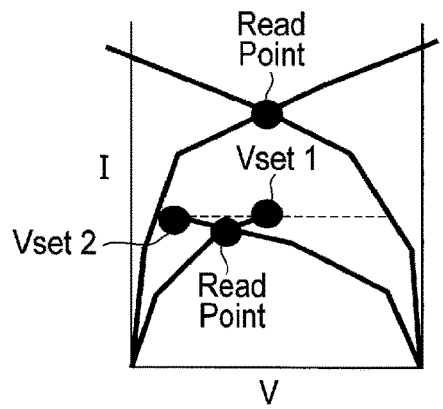
F I G. 20

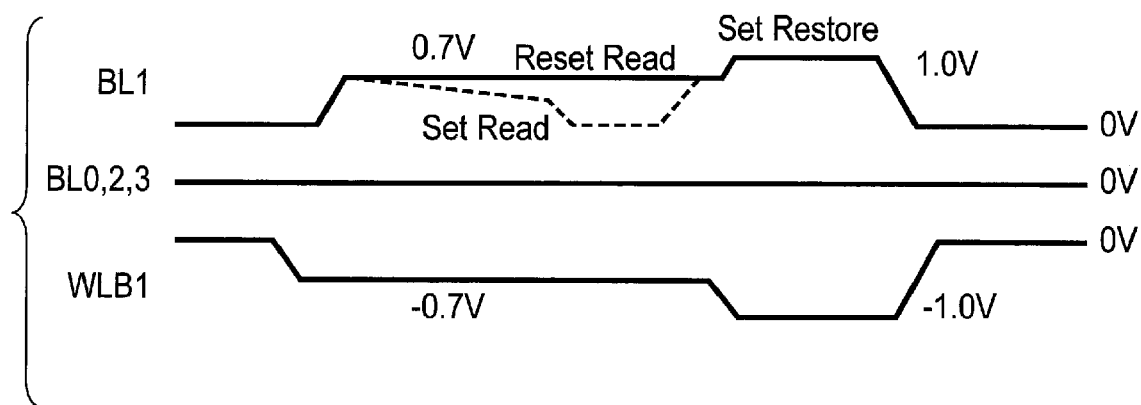
F I G. 21
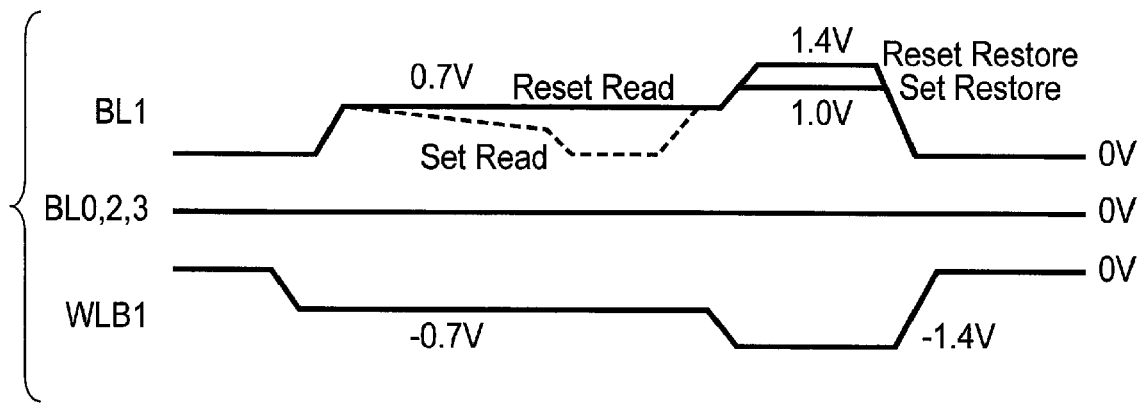
F I G. 22

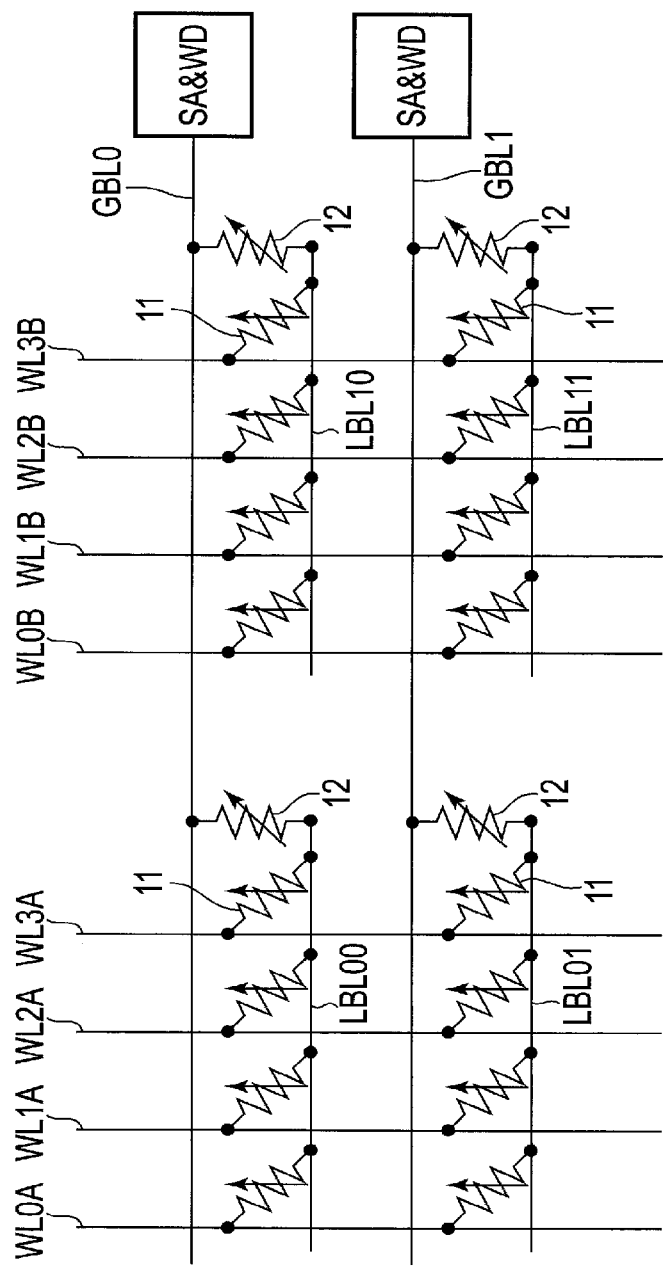
F I G. 23

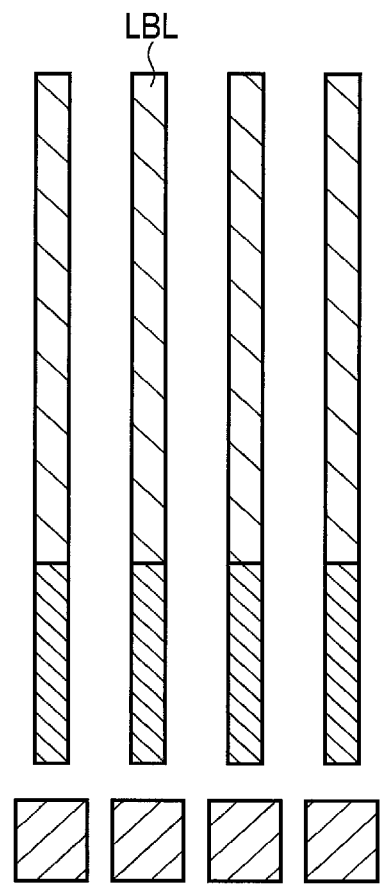
F I G. 26

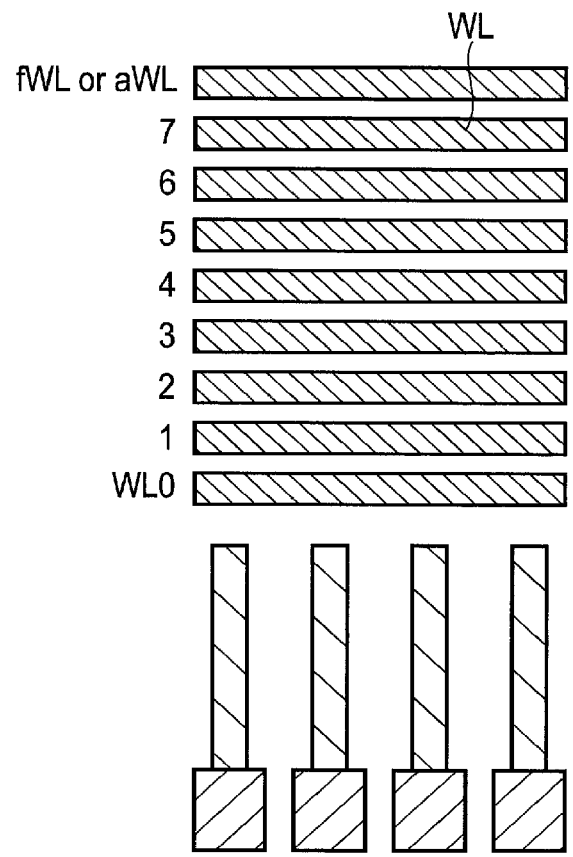
F I G. 27
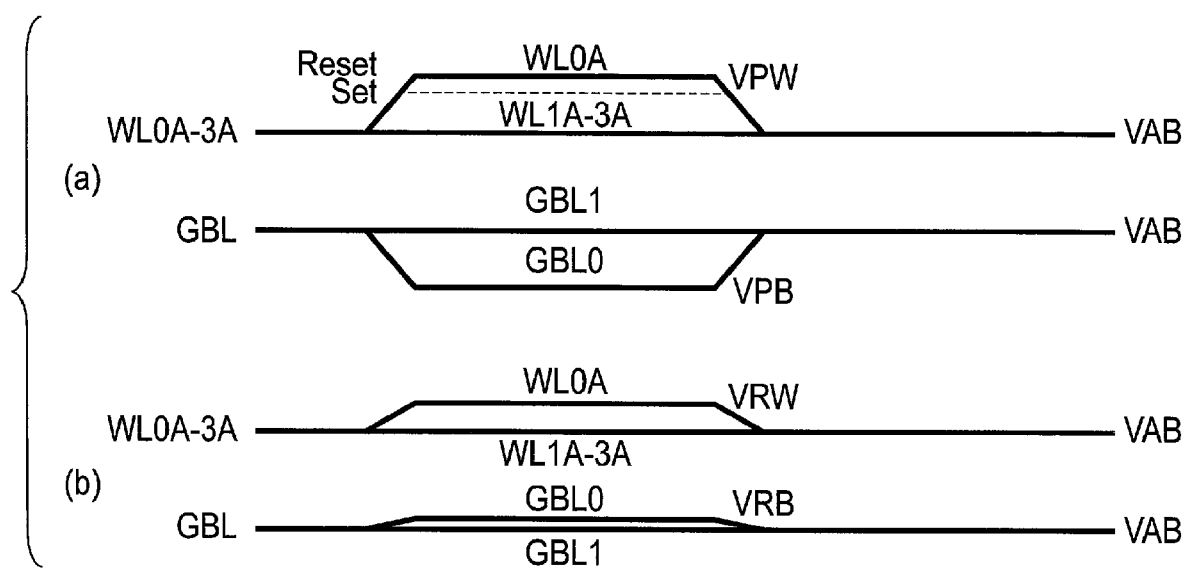
F I G. 28

NONVOLATILE MEMORY DEVICE

CROSS-REFERENCE TO RELATED APPLICATIONS

This application is based upon and claims the benefit of priority from Japanese Patent Application No. 2018-172411, filed Sep. 14, 2018, the entire contents of which are incorporated herein by reference.

FIELD

Embodiments described herein relate generally to a nonvolatile memory device.

BACKGROUND

A nonvolatile memory device (semiconductor integrated circuit device) in which a memory cell is constituted of a series connection of a resistance change memory element and selector element is proposed. In general, in a nonvolatile memory device, as a resistance change memory element, a phase change memory (PCM) element, interfacial phase change memory (iPCM) element or the like is used and, as a selector element, a rectifier element is used.

However, in the above-mentioned existing nonvolatile memory device, the material system of the resistance change memory element and material system of the selector element are different from each other. Accordingly, there are problems such as (a) it is difficult to coordinate the resistance change memory element and selector element with each other in the voltage-current characteristics, (b) it is difficult to make the voltage and current have the same ratios in each of the resistance change memory element and selector element in scaling, and (c) it is difficult to make the temperature characteristics of the resistance change memory element and temperature characteristics of the selector element proportional to each other.

Accordingly, a nonvolatile memory device which makes it possible to coordinate the characteristics of the resistance change memory element and characteristics of the selector element with each other is desired.

BRIEF DESCRIPTION OF THE DRAWINGS

FIG. 1 is a cross-sectional view schematically showing the configuration of a nonvolatile memory device according to an embodiment.

FIG. 2 is an electric circuit diagram showing the configuration of the nonvolatile memory device according to the embodiment.

FIG. 3 is a cross-sectional view schematically showing a first configuration example of a two-terminal resistance change memory element to be used as a memory element and selector element according to the embodiment.

FIG. 4 is a cross-sectional view schematically showing a second configuration example of the two-terminal resistance change memory element to be used as a memory element and selector element according to the embodiment.

FIG. 5 shows views each showing a fundamental principle of operation of the nonvolatile memory device according to the embodiment.

FIG. 6 shows views respectively showing a reset pulse and set pulse of the nonvolatile memory device in the embodiment.

FIG. 7 is a cross-sectional view schematically showing a configuration example of a memory cell array in the nonvolatile memory device according to the embodiment.

FIG. 8 is a cross-sectional view schematically showing a configuration example of a memory cell array in the nonvolatile memory device according to the embodiment.

FIG. 9 is a cross-sectional view schematically showing a first configuration example of the memory cell according to the embodiment.

FIG. 10 is a cross-sectional view schematically showing a second configuration example of the memory cell according to the embodiment.

FIG. 11 is a cross-sectional view schematically showing a third configuration example of the memory cell according to the embodiment.

FIG. 12 is a view for explaining a write operation example of the nonvolatile memory device according to the embodiment.

FIG. 13 shows views each showing an operating point analysis of the write operation example of the nonvolatile memory device according to the embodiment.

FIG. 14 shows timing charts each showing a first specific example of the write operation of the nonvolatile memory device according to the embodiment.

FIG. 15 shows timing charts each showing a second specific example of the write operation of the nonvolatile memory device according to the embodiment.

FIG. 16 is a view for explaining a first read operation example of the nonvolatile memory device according to the embodiment.

FIG. 17 is a view showing an operating point analysis of the first read operation example of the nonvolatile memory device according to the embodiment.

FIG. 18 is a timing chart showing a specific example of the first read operation example of the nonvolatile memory device according to the embodiment.

FIG. 19 shows views for explaining a second read operation example of the nonvolatile memory device according to the embodiment.

FIG. 20 is a view showing an operating point analysis of the second read operation example of the nonvolatile memory device according to the embodiment.

FIG. 21 is a timing chart showing a specific example of the second read operation example of the nonvolatile memory device according to the embodiment.

FIG. 22 is a timing chart showing a specific example of the second read operation example of the nonvolatile memory device according to the embodiment.

FIG. 23 is a view showing an equivalent circuit of a case where the nonvolatile memory device according to the embodiment is applied to a nonvolatile memory device of a three-dimensional structure.

FIG. 26 is a cross-sectional view schematically showing the configuration of a case where the nonvolatile memory device according to the embodiment is applied to a nonvolatile memory device of a three-dimensional structure.

FIG. 27 is a cross-sectional view schematically showing the configuration of a case where the nonvolatile memory device according to the embodiment is applied to a nonvolatile memory device of a three-dimensional structure.

FIG. 28 shows timing charts each showing an operation of a case where the nonvolatile memory device according to the embodiment is applied to a nonvolatile memory device of a three-dimensional structure.

DETAILED DESCRIPTION

Figure 24:
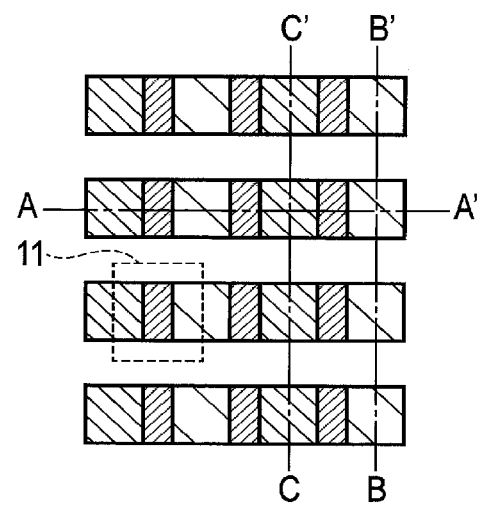
FIG. 24 is a plan view schematically showing the configuration of a case where the nonvolatile memory device according to the embodiment is applied to a nonvolatile memory device of a three-dimensional structure.

In general, according to one embodiment, a nonvolatile memory device includes: a memory cell including a first two-terminal resistance change memory element having a low resistance state and a high resistance state and storing therein memory cell information based on the low resistance state and the high resistance state, and a second two-terminal resistance change memory element having a low resistance state and a high resistance state, connected in series to the first two-terminal resistance change memory element, and functioning as a selector element for selecting the first two-terminal resistance change memory element; a word line connected to one end of the memory cell; and a bit line connected to the other end of the memory cell, wherein the nonvolatile memory device is configured in such a manner that when memory cell information is to be written, if the memory cell is a selected memory cell, the second two-terminal resistance change memory element is set to the low resistance state and, if the memory cell is an unselected memory cell, the second two-terminal resistance change memory element is set to the high resistance state.

Hereinafter, an embodiment will be described with reference to the accompanying drawings.

FIG. 1 is a cross-sectional view schematically showing the configuration of a nonvolatile memory device (semiconductor integrated circuit device) according to an embodiment. FIG. 2 is an electric circuit diagram showing the configuration of the nonvolatile memory device (semiconductor integrated circuit device) according to the embodiment.

As shown in FIG. 1 and FIG. 2, a memory cell 10 is provided between a word line WL and bit line BL, an end of the memory cell 10 is connected to the word line WL, and the other end of the memory cell 10 is connected to the bit line BL. The memory cell 10 is constituted of a series connection of a first two-terminal resistance change memory element 11 and second two-terminal resistance change memory element 12. Between the first two-terminal resistance change memory element 11 and second two-terminal resistance change memory element 12, an electrode 13 is provided, between the first two-terminal resistance change memory element 11 and word line WL, an electrode 14 is provided and, between the second two-terminal resistance change memory element 12 and bit line BL, an electrode 15 is provided. As shown in FIG. 2, a plurality of memory cells 10 are provided in a form of an array, whereby a memory cell array is formed.

The first two-terminal resistance change memory element 11 has a low resistance state and high resistance state (state where the memory element has a resistance higher than in the low resistance state), and stores therein memory cell information based on the low resistance state and high resistance state. The second two-terminal resistance change memory element 12 has a low resistance state and high resistance state, and functions as a selector element configured to select the first two-terminal resistance change memory element 11.

As described above, each of the memory element 11 and selector element 12 uses a two-terminal resistance change memory element, whereby (a) it is possible to coordinate the memory element 11 and selector element 12 with each other in the voltage-current characteristics, (b) it is possible to make the voltage and current have the same ratios in each of the memory element 11 and selector element 12 in scaling, and (c) it is possible to make the temperature characteristics of the memory element 11 and temperature characteristics of the selector element 12 proportional to each other. That is, it is possible to coordinate the characteristics of the memory element 11 and characteristics of the selector element 12 with each other.

It should be noted that in the example shown in FIG. 1 and FIG. 2, although the memory element (first two-terminal resistance change memory element 11) is provided on the word line WL side, and the selector element (second two-terminal resistance change memory element 12) is provided on the bit line BL side, the selector element (second two-terminal resistance change memory element 12) may be provided on the word line WL side, and the memory element (first two-terminal resistance change memory element 11) may be provided on the bit line BL side.

FIG. 3 and FIG. 4 are cross-sectional views each schematically showing a two-terminal resistance change memory element to be used as a memory element 11 or selector element 12.

In the first configuration example shown in FIG. 3, a PCM element is used as the two-terminal resistance change memory element. More specifically, a phase-change layer 10c is provided between an electrode 10a and electrode 10b. As the phase-change layer 10c, a chalcogenide material such as $Ge_xSb_yTe_z$ or the like is used.

In the second configuration example shown in FIG. 4, an interfacial phase change memory (iPCM) element is used as the two-terminal resistance change memory element. More specifically, a superlattice layer 10d is provided between an electrode 10a and electrode 10b. The superlattice layer 10d is formed of a superlattice of $Sb_2Te_3$ layers 10e and GeTe layers 10f.

In the above-mentioned nonvolatile memory device, when the selector element 12 of the selected memory cell 10 is set to the low resistance state, and selector elements 12 of the unselected memory cells 10 are set to the high resistance state, it is possible to execute write and read only to and from the selected memory cell 10. The selector element 12 of the selected memory cell 10 is in the on-state. Accordingly, when it is determined whether the memory element 11 of the selected memory cell 10 is in the low resistance state or in the high resistance state by making a current flow through the selected memory cell 10 and by using an amplifier circuit, the device functions as a nonvolatile memory device.

FIG. 5 shows views each showing a fundamental principle of operation of the nonvolatile memory device described above. FIG. 5(a) is a view showing an operation of the memory element 11, and FIG. 5(b) is a view showing an operation of the selector element 12. In each of FIG. 5(a) and FIG. 5(b), the axis of abscissa indicates voltage V, and axis of ordinate indicates current 1.

In order to realize the aforementioned functions, i.e., in order to make the first two-terminal resistance change memory element 11 function as a memory element, and make the second two-terminal resistance change memory element 12 function as a selector element, a first reset current Ireset1 necessary for the memory element 11 to change from the low resistance state to the high resistance state is made greater than a second reset current Ireset2 necessary for the selector element 12 to change from the low resistance state to the high resistance state as shown in FIG.

5(a) and FIG. 5(b). More specifically, the memory element 11 and selector 12 are made different from each other in the material or shape. For example, the selector element 12 is made to contain therein a predetermined element selected from Al, Ga, In, Tl, Bi, S, Sn, Si, Pb, As, Se, Po, O, C, and N, and the concentration of the predetermined element contained in the selector element 12 is made higher than the concentration of the predetermined element contained in the memory element 11. Thereby, the above-mentioned relationship can be realized.

Under the above-mentioned current condition, write of memory cell information to the memory cell 10 is carried out in the following manner.

First, a voltage/current pulse is applied to the memory cell 10, whereby both the memory element 11 and selector element 12 are set to the low resistance state. Subsequently, a current greater than or equal to the second reset current Ireset1 and less than the first reset current Ireset1 is made to flow through the memory cell 10. Thereby, after completion of application of the voltage/current pulse, the memory element 11 is kept in the low resistance state, and the selector element 12 makes transition to the high resistance state. That is, the selector element 12 enters the off-state, and writing to the memory element 11 for the low resistance state is terminated.

When writing to the memory element 11 for the high resistance state is to be carried out, after setting both the memory element 11 and selector element 12 to the low resistance state by applying a voltage/current pulse to the memory cell 10, a current greater than or equal to the first reset current Ireset1 is made to flow through the memory cell 10. Thereby, after application of the voltage/current pulse is completed, both the memory element 11 and selector element 12 make transition to the high resistance state. That is, the selector element 12 enters the off-state, and write to the memory element 11 for the high resistance state is terminated.

It should be noticed that in the aforementioned write operation, it is not desirable to make the reset pulse steeply fall and make the set pulse slowly fall as in the conventional case. Regarding the set pulse, although when the voltage is increased from the reset state, the set state can be obtained, but thereafter even when a current greater than the first reset current Ireset1 is made to flow, the rest state is hardly obtained.

FIG. 6 shows views respectively showing a reset pulse and set pulse in this embodiment. FIG. 6(a) shows the reset pulse, and FIG. 6(b) shows the set pulse. As shown in FIG. 6, in this embodiment, each of the rest pulse and set pulse has a steep fall. Thereby, the reset state is changed to the set state by applying a fixed voltage, a current flows and the state is changed to the low resistance state. The memory element 11 changes to the high resistance state by a current greater than or equal to the first reset current Irest1, and the selector element 12 changes to the high resistance state by a current greater than or equal to the second reset current Ireset2. As described above, in this embodiment, it is possible to select one of the state where the memory element is on and the selector element 12 is off, and state where the memory element 11 is off and the selector element 12 is off by the difference in the applied pulse current amount.

Each of FIG. 7 and FIG. 8 is a cross-sectional view schematically showing a configuration example of a memory cell array in the nonvolatile memory device according to this embodiment. FIG. 7 is a cross-sectional view in the direction parallel to the word line, and FIG. 8 is a cross-sectional view in the direction parallel to the bit line.

By alternately arranging the word lines WL and bit lines BL shown in FIG. 7 and FIG. 8 in the vertical direction, a three-dimensional memory cell array can be formed. In the example shown in FIG. 7 and FIG. 8, memory cells 10 are arranged between the word lines WLA and bit lines BL on the lower layer side, and between the word lines WLB and bit lines BL on the upper layer side.

In the configuration shown in FIG. 7 and FIG. 8, at the standby time, an intermediate voltage VA is applied to all of the word lines WLA0 to WLA3, word lines WLB0 to WLB3, and bit lines BL0 to BL3. For example, when a memory cell 10 provided at the intersection point of the word line WLB1 and bit line BL1 is to be selected, a voltage of VA−VX/2 is applied to the word line WLB1, and voltage of VA+VX/2 is applied to the bit line BL1. The other unselected word lines WL and bit lines BL are maintained at the intermediate voltage VA. Thereby, a voltage VX is applied to the selected memory cell 10, and a voltage VX/2 (semi-selective voltage) or voltage 0 is applied to the other unselected memory cells 10. More specifically, the voltage VX/2 (semi-selective voltage) is applied to the unselected memory cells 10 connected to the word line WLB1 and unselected memory cells 10 connected to the bit line BL1. Accordingly, it is necessary to set the applied voltage in such a manner that even when half the applied voltage of the selected memory cell 10 is applied to the semi-selective memory cell 10, the selector element 12 of the semi-selective memory cell 10 never enters the on-state. When the memory element 11 is in the low resistance state, the most part of the voltage to be applied to the memory cell 10 is applied to the selector element 12. It is necessary to set the applied voltage in such a manner that the selector element 12 of the semi-selective memory cell 10 never enters the on-state even in such a situation. Accordingly, in this embodiment, it is desirable that the voltage (set voltage Vset2) at which the selector element 12 changes from the high resistance state to the low resistance state be sufficiently greater than the voltage (set voltage Vset1) at which the memory element 11 changes from the high resistance state to the low resistance state.

Next, configuration examples of the memory cell 10 in this embodiment will be described below.

FIG. 9, FIG. 10, and FIG. 11 are cross-sectional views respectively showing first, second, and third configuration examples schematically. In each of the first, second, and third configuration examples, as the memory element 11 and selector element 12, a phase change memory (PCM) element or interfacial phase change memory (iPCM) element is used as already described in connection with FIG. 3 and FIG. 4.

In the first configuration example shown in FIG. 9, the selector element 12 is doped with a more amount of the predetermined element selected from Al, Ga, In, Tl, Bi, S, Sn, Si, Pb, As, Se, Po, 0, C, and N. This is because, normally, in the chalcogenide material used for a phase change memory (PCM) element or interfacial phase change memory (iPCM) element, it is possible to reduce the reset current and increase the set voltage by means of doping using the predetermined element described above. This can be considered as follows. In general, the resistivity of the chalcogenide material is increased by doping. Accordingly, a large voltage is required until the trigger current for bringing about the set state reaches a fixed value, and thus the set voltage increases. Alternatively, the resistance of the part other than the part to be switched also increases, and hence the substantially necessary voltage increases. Further, the amount of heat generation (calorific value) is determined by $IR^2$, and hence when the resistance increases, the amount of heat generation becomes greater even at a small current 1. Accordingly, the reset current decreases.

In the first two-terminal resistance change memory element (memory element 11) and second two-terminal resistance change memory element (selector element 12) of this embodiment, if the reset current and set current can be controlled as described above, it is possible to use the binary or ternary transition metal oxide material ($TaO_x$, $HfO_x$, $WO_x$ or the like), or oxide material or chalcogenide material containing Au or Cu. In the second configuration example and third configuration example shown below, it is possible to carry out control of the reset current and set current described above by using such materials.

In the second configuration example shown in FIG. 10, an electrode 13 used for a heating element is provided between the memory element 11 and selector element 12, and an electrode 15 used for a heating element is provided between the selector element 12 and bit line BL. That is, in the second configuration example, heating elements are provided on both sides of the selector element 12, and a heating element is provided on one side of the memory element 11. By virtue of such a configuration, it is possible to provide more thermal energy by means of the selector element 12 than the memory element 11. As a result, in this configuration example, it is possible to bring the selector element 12 to the reset state by a current smaller than the current used for the memory element 11.

In the third configuration example shown in FIG. 11, the plug-like shape of the selector element 12 is made thinner. That is, the cross-sectional area (cross-sectional area in the horizontal direction) of the selector element 12 is made less than the cross-sectional area (cross-sectional area in the horizontal direction) of the memory element 11. By making the cross-sectional size of the selector element 12 smaller as described above, it is possible to make the selector element 12 highly resistive, and hence it is possible to bring the selector element 12 to the reset state by a smaller current than the memory element 11.

Next, a write operation of the nonvolatile memory device according to this embodiment will be described below.

FIG. 12 is a view for explaining a write operation example of the nonvolatile memory device according to this embodiment. That is, FIG. 12 is a view for explaining an operation to be carried out when memory cell information (information corresponding to the low resistance state, information corresponding to the high resistance state) is to be written to the selected memory cell.

During the standby period, the memory element 11 is in one of the on-state (low resistance state) and off-state (high resistance state), and the selector element 12 is in the off-state (high resistance state). During the set/reset period, a pulse voltage/current is applied across both ends of the selected memory cell 10, whereby both the memory element 11 and selector element 12 are brought to the on-state (low resistance state). The state of each of the memory element 11 and selector element 12 after completion of application of the pulse voltage/current is controlled according to the value of the reset current to be applied thereafter. That is, the memory element 11 is set to one of the on-state and off-state, and the selector element 12 is set to the off-state.

FIG. 13 shows views each showing an operating point analysis for explaining the above-mentioned operation. In FIG. 13(a) and FIG. 13(b), the voltage (V) and current (I) shown on the left side are the characteristics of the memory element 11 in the on-state and off-state, and the voltage (V) and current (I) shown on the right side are the characteristics of the selector element 12 in the on-state and off-state.

Further, in FIG. 13(a) and FIG. 13(b), the axis of abscissa corresponds to the voltage to be applied to the series connection of the memory element 11 and selector element 12.

When a voltage is applied to the series connection of the memory element 11 and selector element 12, the intersection point of the current characteristics on the left side and current characteristics on the right side is the meeting point of the current flowing through the memory element 11 and current flowing through the selector element 12. Further, the voltage from the left end of the FIG. 13(a) or FIG. 13(b) to the meeting point is the voltage (partial voltage) to be applied to the memory element 11, and the voltage from the right end of FIG. 13(a) or FIG. 13(b) to the meeting point is the voltage (partial voltage) to be applied to the selector element 12.

As shown in FIG. 13(a), when the selector element 12 is in the off-state, if a voltage greater than or equal to (Vset1+Vset2) is applied to the series connection of the memory element 11 and selector element 12, both the memory element 11 and selector element 12 are brought to the on-state. The current at this time is greater than or equal to Irest2 and less than Ireset1, and hence after completion of application of the pulse voltage/current, the selector element 12 enters the off-state, and the memory element 11 enters the on-state. That is, the write of set is terminated.

As shown in FIG. 13(b), when the applied voltage is increased, a current greater than or equal to Ireset1 flows through both the memory element 11 and selector element 12. Accordingly, after completion of application of the pulse voltage/current, the selector element 12 enters the off-state, and the memory element 11 also enters the off-state. That is, the write of reset is terminated.

FIG. 14 shows timing charts each showing a first specific example of the write operation described above. FIG. 14(a) is a view showing write of reset, and FIG. 14(b) is a view showing write of set. As shown in FIG. 14(a), at the standby time, all of the nodes are set to 0V and, at the time of write, the voltage of only the selected bit line BL1 is raised to 1.4V, and the voltage of only the selected word line WLB1 is lowered to the voltage of −1.4V. As a result, a voltage of 2.8V is applied to only the selected memory cell (memory cell connected to the selected bit line BL1 and selected word line WLB1). As a result, reset write is executed.

As shown in FIG. 14(b), at the standby time, all of the nodes are set to 0V and, at the time of write, the voltage of only the selected bit line BL1 is raised to 1.0V, and the voltage of only the selected word line WLB1 is lowered to the voltage of −1.4V. As a result, a voltage of 2.4V is applied to only the selected memory cell (memory cell connected to the selected bit line BL1 and selected word line WLB1). As a result, set write is executed.

FIG. 15 shows timing charts each showing a second specific example of the write operation described above. FIG. 15(a) is a view showing reset write, and FIG. 15(b) is a view showing set write.

When the current after a state where the applied voltage (Vset1+Vset2) is high and the memory element 11 and selector element 12 is brought to the on state is obtained becomes greater than or equal to Irest1, there is sometimes a case where a setting operation cannot be carried out. In such a case, as shown in FIG. 15(b), after applying a voltage (2.8V) greater than or equal to (Vset1+Vset2), the applied voltage is lowered to 2.4V, whereby the set condition is established. In this manner, set write may also be executed.

Next, a read operation of the nonvolatile memory device according to this embodiment will be described below.

When memory cell information is read from the selected memory cell, a pulse voltage/current is applied to the memory cell. At that time, when the memory element 11 is in the high resistance state, the selector element 12 maintains the high resistance state. This is because both the memory element 11 and selector element 12 are in the high resistance state, and hence each of the voltages divided by the memory element 11 and selector element 12 falls short of the voltage that makes each of the memory element 11 and selector element 12 enter the low resistance state. When the memory element 11 is in the low resistance state, the selector element 12 makes a transition to the low resistance state. This is because when the memory element 11 is in the low resistance state, the most part of the voltage applied to the memory cell 10 is applied to the selector element 12 in the high resistance state and, as a result, the selector element 12 enters the low resistance state.

As described above, the pulse voltage/current is applied to the memory cell 10, whereby, when the memory element 11 is in the high resistance state, the selector element 12 maintains the high resistance state and, when the memory element 11 is in the low resistance state, the selector element makes a transition to the low resistance state. Accordingly, when the memory element 11 is in the high resistance state, the whole of the memory cell 10 also enters the high resistance state and, when the memory element 11 is in the low resistance state, the whole of the memory cell 10 also enters the low resistance state. Accordingly, by detecting a current flowing into the bit line through the memory cell 10 by means of an amplifier circuit, it is possible to determine the memory cell information.

After completion of application of the pulse voltage/current to the memory cell 10, when the selector element 12 is in the on-state (low resistance state), it is necessary to bring the selector element 12 to the off-state. Thus, a current greater than or equal to a second current and less than a first current is made to flow through the memory cell 10. As a result, after completion of application of the pulse voltage/current, the memory element 11 is set to the low resistance state, and the selector element 12 is set to the high resistance state (off-state).

Further, in the case where the memory element 11 is in the low resistance state and the selector element 12 is in the low resistance state, when the voltage to be applied to the memory cell 10 and necessary to make the second reset current required to bring the selector element 12 to the off-state flow through the memory cell 10 is greater than the voltage required to bring both the memory element 11 and selector element 12 to the low resistance state when the memory element 11 is in the high resistance state and the selector element 12 is in the high resistance state, it is possible to terminate application of the pulse voltage/current while keeping the memory element 11 in the high resistance state and the selector element 12 in the high resistance state. However, conversely, when the aforementioned applied voltage is less than the above required voltage, i.e., when both the memory element 11 in the high resistance state and the selector element in the high resistance state enter the low resistance state, it becomes necessary to carry out a rewrite according to the read state of the memory element 11. When the memory element 11 is in the low resistance state from the beginning, it is necessary to make a current greater than or equal to the second reset current and less than the first reset current flow through the memory cell 10 to thereby bring the memory element 11 to the low resistance state and bring the selector element 12 to the high resistance state (off-state). When the memory element 11 is in the high resistance state from the beginning, it is necessary to make a current greater than or equal to the first reset current flow through the memory cell 10 to thereby bring the memory element 11 to the high resistance state and bring the selector element 12 to the high resistance state (off-state).

FIG. 16 is a view for explaining a first read operation example of the nonvolatile memory device according to this embodiment. That is, FIG. 16 is a view for explaining a first read operation to be carried out when memory cell information (information corresponding to the low resistance state, information corresponding to the high resistance state) is read from the selected memory cell. FIG. 17 is a view showing an operating point analysis of the first read operation example. How to scrutinize FIG. 17 is identical to the case of FIG. 13. FIG. 18 is a timing chart showing a specific example of the first read operation example.

As shown in FIG. 16, read is carried out when the selector element 12 is in the off-state. In this case, as shown in FIG. 17, a voltage less than the set voltage Vset2 of the selector element 12 is applied to the memory element 11 both when the memory element 11 is in the on-state and when the memory element 11 is in the off-state. Accordingly, the memory element 11 does not change from the off-state to the on-state, and read is carried out while the memory information of the memory element 11 is retained. In the example of FIG. 18, a voltage of 1V is applied to the selected memory cell 10. The set voltage of the selector element 12 is set higher than the set voltage of the memory element 11, and hence the selector element 12 does not enter the on-state. In this case, in each of the memory element 11 and selector element 12, information-nondestructive read can be carried out, and hence it is possible to shorten the read time. However, the selector element 12 is in the off-state, and hence the resistance of the memory cell is (Ron+Roff) or (Roff+Roff). Accordingly, the resistance ratio is about 2, and there is a problem that it is difficult to obtain a high signal ratio.

FIG. 19 shows views for explaining a second read operation example of the nonvolatile memory device according to this embodiment. FIG. 20 is a view showing an operating point analysis of the second read operation example. How to scrutinize FIG. 20 is identical to the case of FIG. 13.

In the second read operation example, as shown in FIG. 19, there are a case (a) where a rewrite to the memory element 11 is unnecessary and case (b) where a rewrite to the memory element 11 is necessary. In the case where a rewrite is unnecessary, as shown in FIG. 20, when the read voltage is applied, if the memory element 11 is in the on-state, a voltage greater than or equal to Vset2 is applied to the selector element 12, whereby the selector element 12 is brought to the on-state. If the memory element 11 is in the off-state, both the memory element 11 and selector element 12 are in the off-state, and hence the applied voltage is divided, a voltage less than Vset1 and less than Vset2 is applied to each of the memory element 11 and selector element 12, and each of the memory element 11 and selector element 12 is kept in the reset state. Accordingly, both the memory element 11 and selector element 12 are in the on-state or both the memory element 11 and selector element 12 are in the off-state, and hence when the memory cell 10 is a phase change-system memory cell, an about 2 to 3-digit resistance ratio can be obtained, and it is easily possible to determine the memory cell information by detecting the current flowing through the memory cell 10 by means of an amplifier. Thereafter, when the selector element 12 is brought to the off-state, the read operation is terminated. When both the memory element 11 and selector element 12 are in the off-state, the voltage to be applied to the memory cell 10 at the time of read is less than Vset1+Vset2. Under such conditions, when the current of the case where both the memory element 11 and selector element 12 are in the on-state is less than Ireset1 and greater than or equal to Irest2, an operation shown in FIG. 21 is carried out, when the read pulse is decreased, the selector element 12 is restored to the reset state, the state of the memory element 11 is maintained, and transition to the standby state is enabled.

However, when both the memory element 11 and selector element 12 are in the off-state, the voltage to be applied to the memory cell 10 at the time of read is less than Vset1+Vset2. Under such conditions, when the current of the case where both the memory element 11 and selector element 12 are in the on-state is less than Ireset1, it is not possible to bring the selector element 12 to the reset state in the case where both the elements 11 and 12 are in the on-state while maintaining both the elements 11 and 12 in the off-state. Accordingly, as shown in FIG. 22, after both the elements 11 and 12 are brought to the on-state by once applying a voltage greater than or equal to Vset1+Vset2 to the memory cell 10, if the read state of the memory element 11 is the on-state, a current greater than or equal to Irest2 and less than 'reset' is made to flow, whereby the memory element 11 is brought to the on-state and the selector element 12 is brought to the off-state. If the read state of the memory element 11 is the off-state, a current greater than or equal to Ireset1 is made to flow, whereby a rewrite for bringing the memory element 11 to the off-state and bringing the selector element 12 to the off-state is carried out.

Figure 25:
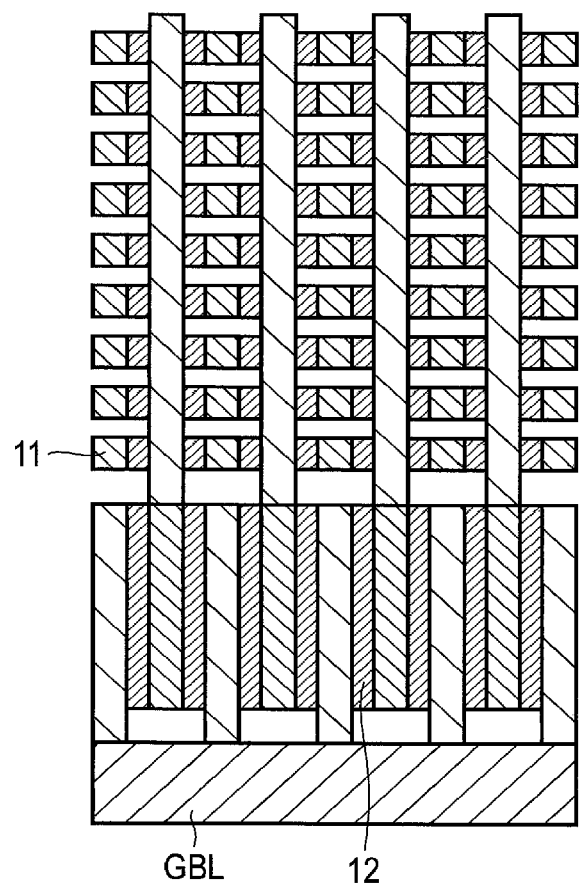
FIG. 25 is a cross-sectional view schematically showing the configuration of a case where the nonvolatile memory device according to the embodiment is applied to a nonvolatile memory device of a three-dimensional structure.

FIG. 23 is a view showing an equivalent circuit of a case where the above-mentioned nonvolatile memory device is applied to a nonvolatile memory device of a three-dimensional structure. FIG. 24 is a plan view schematically showing the configuration of a case where the above-mentioned nonvolatile memory device is applied to a nonvolatile memory device of a three-dimensional structure. FIG. 25, FIG. 26, and FIG. 27 are cross-sectional views schematically showing the configurations respectively along line A-A', line B-B', and line C-C' of FIG. 24. FIG. 28 shows timing charts each showing an operation of a case where the above-mentioned nonvolatile memory device is applied to a nonvolatile memory device of a three-dimensional structure.

Global bit lines GBL0 and GBL1 shown in FIG. 23 are arranged in the horizontal direction (direction parallel to the principal surface of the semiconductor substrate (not shown)) as shown in FIG. 25, FIG. 26, and FIG. 27. Local bit lines LBL00, 01, 10, and 11 shown in FIG. 23 are arranged in the vertical direction (direction perpendicular to the principal surface of the semiconductor substrate (not shown)). Word lines WL0A to WL3A, WL0B to WL3B, and WL0 to WL7 are arranged in the horizontal direction. Further, memory elements 11 are provided at intersection points of the local bit lines LBL and word lines WL, and selector elements 12 are provided between the local bit lines LBL and global bit lines GBL. As in the case of the embodiment already described above, each of the memory elements 11 and selector elements 12 is formed of a two-terminal resistance change memory element.

As shown in FIG. 28, at the standby time, all the nodes are set to the intermediate potential VAB and, at the time of write and read, a predetermined voltage is applied between the word lines WL and global bit lines GBL. Further, as in the case of the embodiment already described above, the selector elements 12 are made to change from the off-state to the on-state, whereby read and write are carried out and, at the time of write, a current greater than or equal to Ireset1 and less than Ireset1 is made to flow, whereby the memory element 11 is brought to the on-state and the selector element 12 is brought to the off-state and, then a current greater than or equal to Ireset1 is made to flow, whereby the memory element 11 is brought to the off-state and the selector element 12 is brought to the off-state.

Although other unselected memory elements 11 are also connected to the local bit lines LBL, the potential of the word lines WL controlling these unselected memory elements 11 is made to have a value close to VAB, whereby it is possible to reduce erroneous switching of the unselected memory elements 11, and influence of a sneak current or the like.

As described above, this embodiment can also be applied to a nonvolatile memory device of a three-dimensional structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
   a memory cell including a first two-terminal resistance change memory element having a low resistance state and a high resistance state and storing therein memory cell information based on the low resistance state and the high resistance state, and a second two-terminal resistance change memory element having a low resistance state and a high resistance state, connected in series to the first two-terminal resistance change memory element, and functioning as a selector element for selecting the first two-terminal resistance change memory element;
   a word line connected to one end of the memory cell; and
   a bit line connected to the other end of the memory cell, wherein
   the nonvolatile memory device is configured in such a manner that when memory cell information is to be written, if the memory cell is a selected memory cell, the second two-terminal resistance change memory element is set to the low resistance state and, if the memory cell is an unselected memory cell, the second two-terminal resistance change memory element is set to the high resistance state.

2. The device of claim 1, wherein
   a first current necessary for the first two-terminal resistance change memory element to change from the low resistance state to the high resistance state is greater than a second current necessary for the second two-terminal resistance change memory element to change from the low resistance state to the high resistance state.

3. The device of claim 2, wherein
   in a case where the memory cell is a selected memory cell, when the memory cell information is to be written to the memory cell, a pulse voltage is applied to the memory cell, whereby the first two-terminal resistance change memory element and the second two-terminal resistance change memory element are brought to the low resistance state, and a current greater than or equal to the second current and less than the first current is made to flow through the memory cell, whereby after completion of application of the pulse voltage, the first two-terminal resistance change memory element is set to the low resistance state, and the second two-terminal resistance change memory element is set to the high resistance state, and a current greater than or equal to the first current is made to flow through the memory cell, whereby after completion of application of the pulse voltage, the first two-terminal resistance change memory element is set to the high resistance state, and the second two-terminal resistance change memory element is set to the high resistance state.

4. The device of claim 2, wherein
in a case where the memory cell is a selected memory cell, when the memory cell information is to be read from the memory cell, a pulse voltage is applied to the memory cell, whereby if the high resistance state is set to the first two-terminal resistance change memory element, the second two-terminal resistance change memory element is set to the high resistance state and, if the low resistance state is set to the first two-terminal resistance change memory element, the second two-terminal resistance change memory element is set to the low resistance state.

5. The device of claim 4, wherein
when the low resistance state is set to the first two-terminal resistance change memory element and the low resistance state is set to the second two-terminal resistance change memory element, a current greater than or equal to the second current and less than the first current is made to flow through the memory cell, whereby after completion of application of the pulse voltage, the first two-terminal resistance change memory element is set to the low resistance state and the second two-terminal resistance change memory element is set to the high resistance state.

6. The device of claim 4, wherein
when the high resistance state is set to the first two-terminal resistance change memory element and the high resistance state is set to the second two-terminal resistance change memory element, a current greater than or equal to the first current is made to flow through the memory cell, whereby the first two-terminal resistance change memory element and the second two-terminal resistance change memory element are brought to the low resistance state and, after completion of application of the pulse voltage, the first two-terminal resistance change memory element is set to the high resistance state and the second two-terminal resistance change memory element is set to the high resistance state.

7. The device of claim 2, wherein
a second voltage at which the second two-terminal resistance change memory element changes from the high resistance state to the low resistance state is greater than a first voltage at which the first two-terminal resistance change memory element changes from the high resistance state to the low resistance state.

8. The device of claim 7, wherein
when the memory cell is a selected memory cell, a voltage to be applied to other unselected memory cells connected to the word line and a voltage to be applied to other unselected memory cells connected to the bit line are less than or equal to half a voltage to be applied to the memory cell.

9. The device of claim 1, wherein
a material for the first two-terminal resistance change memory element and the second two-terminal resistance change memory element is selected from a chalcogenide material containing Ge, Sb, and Te, a superlattice material formed by stacking layers containing Ge and Te and layers containing Sb and Te, a binary or ternary transition metal oxide material, and an oxide material or a chalcogenide material containing Au or Cu.

10. The device of claim 9, wherein
the second two-terminal resistance change memory element contains a predetermined element selected from Al, Ga, In, Tl, Bi, S, Sn, Si, Pb, As, Se, Po, O, C, and N, and a concentration of the predetermined element contained in the second two-terminal resistance change memory element is greater than a concentration of the predetermined element contained in the first two-terminal resistance change memory element.

11. The device of claim 1, further comprising:
a first heating element provided between one end of the first two-terminal resistance change memory element and one end of the second two-terminal resistance change memory element; and
a second heating element provided at the other end of the second two-terminal resistance change memory element.

* * * * *